United States Patent [19]

Narusawa

[11] Patent Number: 5,079,186
[45] Date of Patent: Jan. 7, 1992

[54] PRODUCTION METHOD, PRODUCTION INSTRUMENT, AND HANDLING METHOD OF COMPOUND SEMICONDUCTOR QUANTUM BOXES, AND LIGHT EMITTING DEVICES USING THOSE QUANTUM BOXES

[75] Inventor: Tadashi Narusawa, Hirakata, Japan

[73] Assignee: Matsushita Electric Industrial Co., Ltd., Osaka, Japan

[21] Appl. No.: 367,570

[22] Filed: Jun. 19, 1989

[30] Foreign Application Priority Data

Jun. 21, 1988 [JP] Japan .................. 63-153240

[51] Int. Cl.⁵ .................................... H01L 21/20
[52] U.S. Cl. .................................... 437/133; 487/126; 487/129; 487/105
[58] Field of Search .................. 148/DIG. 6, 18, 22, 148/41, 56, 65, 72, 95, 110, 160, 169, 33, 33.1, 33.4; 156/610–614; 427/248.1, 255.1; 118/50.1, 620, 726, 723; 437/18, 81, 105, 107, 108, 110, 126, 129, 133, 936, 945, 949, 925

[56] References Cited

U.S. PATENT DOCUMENTS

| | | | |
|---|---|---|---|
| 4,575,924 | 3/1986 | Reed et al. | 437/105 |
| 4,748,132 | 5/1988 | Fukuzawa et al. | 437/129 |
| 4,751,194 | 6/1988 | Cibert et al. | 437/126 |
| 4,783,427 | 11/1988 | Reed et al. | 437/133 |

Primary Examiner—Robert Kunemund
Assistant Examiner—M. Witczewski
Attorney, Agent, or Firm—Stevens, Davis, Miller & Mosher

[57] ABSTRACT

Realized are a method and instrument for producing compound semiconductor crystallized ultrafine particles of Groups II–VI or Groups III–V making use of a vapor phase reaction of an element of Group II or III with an element of Group IV or V, and further a gain modulation type quantum box laser element of high performance constructed by geometrically disposing the ultrafine particles.

6 Claims, 5 Drawing Sheets

PRODUCTION METHOD, PRODUCTION INSTRUMENT, AND HANDLING METHOD OF COMPOUND SEMICONDUCTOR QUANTUM BOXES, AND LIGHT EMITTING DEVICES USING THOSE QUANTUM BOXES

BACKGROUND OF THE INVENTION

Recently, ultrafine particles (diameter ~100 Å) have been vigorously studied and developed from both a purely academic aspect for experimentally solving Kubo effect and the like and an industrial aspect for utilizing them as ornaments, magnetic memory elements and the like [Hayashi; J. Vac. Sci. Technol. A5(4), 1375 (1987)]. Materials thereof, however, are limited to simple metal such as gold, iron and the like or stable oxides such as alumina and the like, and thus there is no example indicating that ultrafine particles of compound semiconductors are produced. While metallic ultrafine particles are obtained by thermally evaporating metal in the atmosphere of an inert gas such as an argon gas and the like (pressure ~1 Torr) wherein a mean free path is restricted, the inert gas only restricts the mean free path of metallic atoms and is not taken into the ultrafine particles in this case.

While most attempts to produce ultrafine particles (quantum boxes) of the compound semiconductors have encountered severe difficulties and the prospects for realizing such particles are very dim, there are some prospective techniques being investigated. One of them is a method to combine an ultra thin film epitaxial growth method such as Molecular Beam Epitaxy (MBE), metalorganic Vapor Phase Epitaxy (MOVPE) and the like with a local processing method (etching, doping, disordering) effected by Focused Ion Beam (FIB). There is also a potential technique wherein a selective wet etching is used in place of the FIB processing. In any case, while this method is to process one dimensionally quantized structure layered by the MBE to expand a quantized dimension, achieving processing to an accuracy of ~100 Å is yet difficult and greatly dependent on a development to be achieved hereinafter. Another method locally deposits compound semiconductors directly or indirectly on a suitable substrate using thin needle electrodes. This method which seems flexible and attractive at first glance has a problem in reliability and reproducibility because a substrate and a temperature causing a successful epitaxial growth must be selected in practice and further the thin electrodes must be operated under severe epitaxy conditions.

With respect to a handling method of ultrafine particules, a prior art manipulator is in its primitive stage. There is of course no embodiment for handling ultrafine particles of compound semiconductors and metallic ultrafine particles are only handled by such methods that fine particles evaporated in the above inert gas and deposited on a wall are gathered by a brush or the fine particles are transported onto a sample stage of an electron microscope through a micro-jet stream.

Zealous developments are in progress to improve the performance and degree of integration of a semiconductor laser. At present, however, a quantum well laser making use of a one dimensionally quantized and layered thin film structure cannot provide excellent threshold current density, line width and temperature characteristics because quantization is not effected in a direction parallel to the thin film and defects such as steps exist. There are some methods for reducing interface defects such as by carefully controlling conditions for a thin film growth effected by the MBE or the like. If an ideal interface is realized, the characteristics of laser will be improved as necessary. The fact, however, that the quantization is not affected in the direction parallel to the thin film as a principle must remain as a factor for reducing the laser characteristics.

With respect to the integration of a semiconductor laser, a general structure including a Fabry-Perot type resonator is not basically suitable. There is an example wherein a mirror face not inferior to a cleaved facet is created on a substrate by reactive ion beam etching and a Fabry-Perot resonator is fabricated using it. Nevertheless, it is apparent that a stepped structure caused by this processing is a large obstacle to the integration of other elements. A prototype laser [Distributed Feedback (DFB) laser] provided with an embedded diffraction grating in place of a reflection edge is fabricated with advantageous characteristics. A usual DFB laser, however, only feeds back light of a particular wavelength diffused from a diffraction grating and uses it to control an oscillation mode, and thus gain is not modulated.

Since three dimensional quantum boxes have a very sharp discrete energy level, the application thereof to the active layer of a semiconductor laser can provide high performance laser. To obtain the three dimensional quantum boxes, however, ultrafine particles with a diameter of hundreds of Angstroms or less must be prepared. It is very difficult to produce this size of ultrafine particles of compound semiconductors of Groups III-V (or Groups II-VI), and then none of the tests making use of the FIB processing has been successful. Further, even if these ultrafine particles are produced, a method for sizing and handling them based on a new principle and a manipulator are required because their size is too small.

A compound semiconductor laser is integrated (opto-electronic integrated circuit: OEIC) to be used in communication, data processing, opto-computer applications and the like. While an example of a prototype OEIC is reported, the degree of integration thereof is still very low and said to be retarded more than ten years than a Si technology. To increase the degree of integration of the OEIC, the semiconductor laser must be arranged to a structure without a Fabry-Perot type resonator. A DFB laser aiming at single mode oscillation, narrow line width and improved temperature characteristics in addition to the above arrangement is being developed. While the DFB laser does not require an edge mirror, it cannot yet provide micro laser and improved laser characteristics at the present stage.

SUMMARY OF THE INVENTION

The present invention provides a production method of compound semiconductor quantum boxes, a production instrument thereof, a handling method of ultrafine particles such as the compound semiconductor quantum boxes and the like, and light emitting devices using the quantum boxes. According to the present invention, the method of producing compound semiconductor quantum boxes comprises the steps of evaporating an element of Group III or II in a pressurized space controlled by a vapor of an element of Group V or VI and producing the compound semiconductor quantum boxes of Groups III-V or Groups II-VI making use of reaction in a vapor phase. In addition, the production instrument of the compound semiconductor quantum boxes comprises a partial pressure control device for controlling a partial pressure of an element of Group V or VI, an evaporation rate control device for controlling an evaporation rate of an element of Group III or II, and a sizing and storing device for sizing and storing particles of the produced quantum boxes for producing the compound semiconductor quantum boxes of Groups III-V or Groups II-VI making use of a vapor phase reaction according to the above-mentioned process.

Further, a method of handling the ultrafine particles such as the compound semiconductor quantum boxes comprises the steps of charging respective ultrafine particles and causing an electrostatic force to act on the ultrafine particles by regulating a voltage imposed on needle electrodes for transporting the ultrafine particles to any arbitrary location and disposing the same there. In addition, the present invention provides a light emitting device which comprises the compound semiconductor quantum boxes disposed one dimensionally, two dimensionally or three dimensionally in synchronism with a wavelength of emitted light for constructing a gain modulation type laser device.

According to the present invention, the crystallized ultrafine particles are produced making use of a vapor phase reaction of the element of Group II or III with the element of Group IV or V, and the ultrafine particles can be sized, stored, transported and disposed by using an electrostatic (magnetic) force, respectively. Further, a gain modulation type laser element of high performance can be realized by using, as the active layer thereof, the quantum boxes which are composed of the ultrafine particles of the compound semiconductors prepared by the method and instrument of the present invention and disposed in synchronism with the wavelength of emitted light.

The present invention intends to apply the compound semiconductor ultrafine particles to the active layer of a light emitting device as quantum boxes in the field of opto-electronics. Widely recognized is a possibility that a device having a new function may be obtained by using a quantum effect eminently appearing when the active layer is subjected to a sub-micron processing. Conventional processing techniques, however, are very difficult to prepare a material (quantum boxes) which is quantized up to three dimension and only produce a layered thin film structure quantized one dimensionally by a molecular beam epitaxy (MBE) at best. The present invention overcomes this drawback, greatly increases a degree of freedom for producing quantum boxes, whereby a semiconductor laser diode of high performance having low threshold current value, narrow line width and improved temperature characteristics. Further, the disposition of the quantum boxes as the active layer of the laser device in synchronism with the wavelength of the emitted light enables laser oscillation to be effected in the direction of the disposition of the quantum boxes without the need for the resonator, which contributes to the integration of the semiconductor laser.

Figure 1:
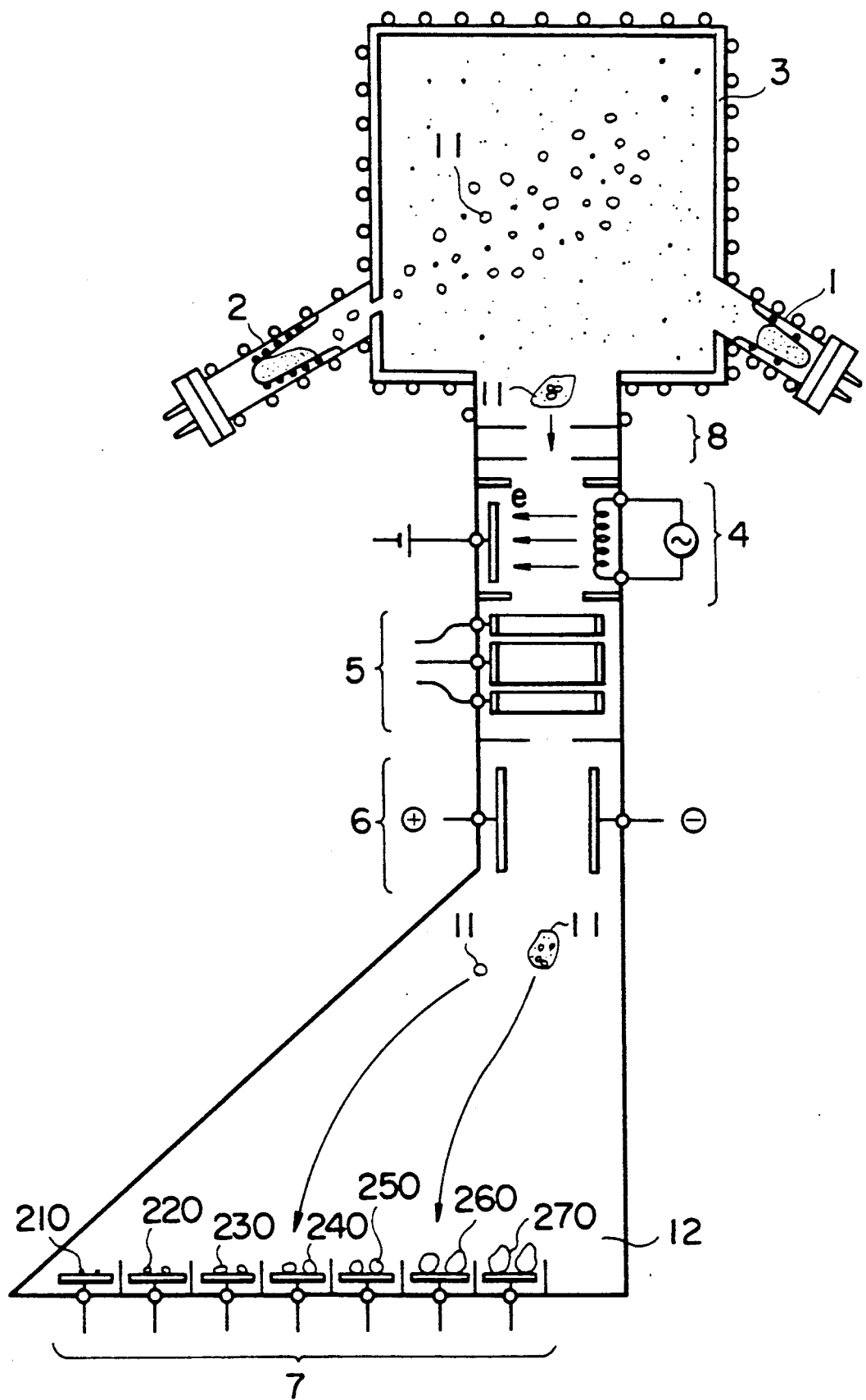
FIG. 1 is a schematic diagram of a production instrument of ultrafine particles of compound semiconductors making use of a gas phase reaction according to the present invention.

The following reference numerals are used throughout the drawings:

1 ... arsenic vapor source, 2 ... gallium molecular beam source, 3 ... reaction chamber, 4 ... fine particle charging device, 5 ... charged fine particle converging device, 6 ... electrostatic deflector, 7 ... fine particle storing device, 8 ... particle taking-in and differential pumping device, 11 ... charged ultra-fine particles, 12 ... unconductive type storing plate, 13 ... needle electrode, 14 ... insulating film, 21 ... n type substrate, 22 ... n type clad layer, 23 ... current block layer, 24 ... compound semiconductor quantum boxes, 25 ... p type clad layer, 26 ... cap layer

DETAILED DESCRIPTION OF THE INVENTION

A means, operation and embodiments according to the present invention will be described below with reference to drawings.

FIG. 1 shows a general idea for a method of producing ultrafine particles of compound semiconductors making use of a gas phase reaction and a schematic arrangement of an instrument for the method. Description will be made with reference to the production of ultrafine particles of GaAs as an example. Designated at 1 is an arsenic vapor source containing metallic arsenic. When the temperature of the vapor source 1 is regulated in the range of 200° C. to 500° C., the vapor pressure of the arsenic in the reaction chamber can be changed in the range of $10^{-4}$ Torr to 100 Torr. At the time, the temperature of the reaction chamber 3 is increased by a heater to a temperature substantially similar to the temperature of the arsenic vapor source 1 to prevent the arsenic vapor from condensing on a wall of the chamber. Designated at 2 is a Ga molecular beam source and essentially the same as a Knudesen cell (K-cell) used in a usual MBE device. This source operates in the range of 800° C. to 1200° C. and supplies a Ga atom beam at $10^{14}$ to $10^{17}$ atom/cm$^2$.sec. Note that in FIG. 1 while both the As source and the Ga source are composed of a solid source used in the usual MBE, they may be composed of a gas source such as arsine (AsH$_3$), tri-methyl gallium [Ga(CH$_3$)$_3$] and the like in place of the solid source. The reaction chamber 3 is provided with an ultrahigh vacuum pumping system capable of pumping background pressure to $10^{-11}$ Torr or less to prevent impurities from being mixed with ultrafine particles.

Ga atoms charged in the reaction chamber 3 from the Ga source 2 collide against arsenic molecules (mixture of As, AS$_2$ and AS$_4$) and react with them to form GaAs$_n$ molecules (n=1~4). These molecules (in particular, molecules rich with the number of As atoms) have a low probability to combine with arsenic molecules next and high probability to combine with Ga atoms from a view point of energy. When they combine with the Ga atoms once, they are liable to combine with arsenic molecules on the contrary. This tendency is derived from that the combination of Ga and As has an ion property to a certain degree. The GaAsn molecules produced first repeat collision and reaction with Ga and Asn molecules many times to grow into GaAs fine crystal particles. As easily presumed from this reaction mechanism, the growing rate of the fine crystals depends on the mean free path of molecules, i.e., the density of the Ga and Asn molecules in the reaction chamber. Then, the regulation of them (by changing the temperature of the K-cell and the flow rate of the gas) can change the growing rate, i.e., the size of the fine particles produced in a wide range. Note that although not shown in FIG. 1, the reaction can be accelerated, for example, by a laser beam irradiated at the vicinity of the central portion of the reaction chamber to thermally or optically excite the molecules.

The GaAs fine particles produced as described above fall to the lower portion of the reaction chamber due to gravity while they continuously grow. Since the reaction chamber has a limited volume, the size of the fine particles has a certain distribution. In FIG. 1, reference 4 through 8 schematically show a method and devices for sizing and storing the produced fine particles, wherein 8 designates a fine particle taking-in device also serving as an orifice for differentially pumping the reaction chamber 3 and fine particle sizing/storing devices 4–7. This differential pumping system enables the sizing/storing devices to operate in high vacuum ($\leq 10^{-5}$ Torr) against the high pressure ($\leq 100$ Torr) in the reaction chamber. Designated at 4 is a fine particle charging device including an electron source such as a tungsten filament and the like and an anode, 5 designates an electrostatic or magnetic lens device for converging charged fine particles, 6 designates an electrostatic deflector for giving a horizontal moment to the charged fine particles. The charged fine particles passing through the electrostatic deflector 6 are sized and stored in the fine particle storing device 7 with each size, drawing the parabolic trajectory determined by charging state and mass (size). The storing device 7 is provided with a multiplicity of partitions and a multiplicity of respectively independent storing plates 12. Two kinds of these storing plates 12 are prepared, one of them being composed of a conductive material and the other being composed of an unconductive material. The conductive type storing plate 12 is used to monitor the amount of the fine particles produced (number) and the producing rate thereof by the measurement of the electric pulse of charged fine particles falling thereon. The unconductive type plate 12 is used to preserve the charged state of the charged fine particles and enable the particles to be handled hereinafter. These two kinds of storing plates can be disposed side by side for simultaneous use. Further, since the charged state of the fine particles is preserved in the unconductive type storing plate, repulsion arises among the fine particles and thus the fine particles disperses and fall to the storing plates, which is advantageous for the handling the fine particles hereinafter.

In FIG. 1, 210 through 270 designate the fine particles sized and stored in the storing plates 12. The fine particles 11 passing through the electrostatic reflector 6 has a trajectory which is determined by both the gravity acting downward dependent on the size (mass) of the particles and the electrostatic force acting horizontally dependent on the charged state of the particles. Therefore, the regulation of the voltage imposed on the electrodes of the electrostatic reflector 6 enables the particles having desired sizes to be stored in the storing plates 12. In FIG. 1, the respective particles have sizes as follows: 210=20A or less, 220=20~50A, 230; 50~80A, 240; 80~100A, 250=100~120A, 260=150~160A, and 270=200A or more.

While these fine particles 210~270 produced and stored as described above are used in the active region of various devices as quantum boxes having specific property, usual methods of taking-out, transportation and disposition are not of course applicable because they have a very fine size. Usual methods of taking-out, transportation and disposition of ultrafine particles will be described below.

Figure 2:
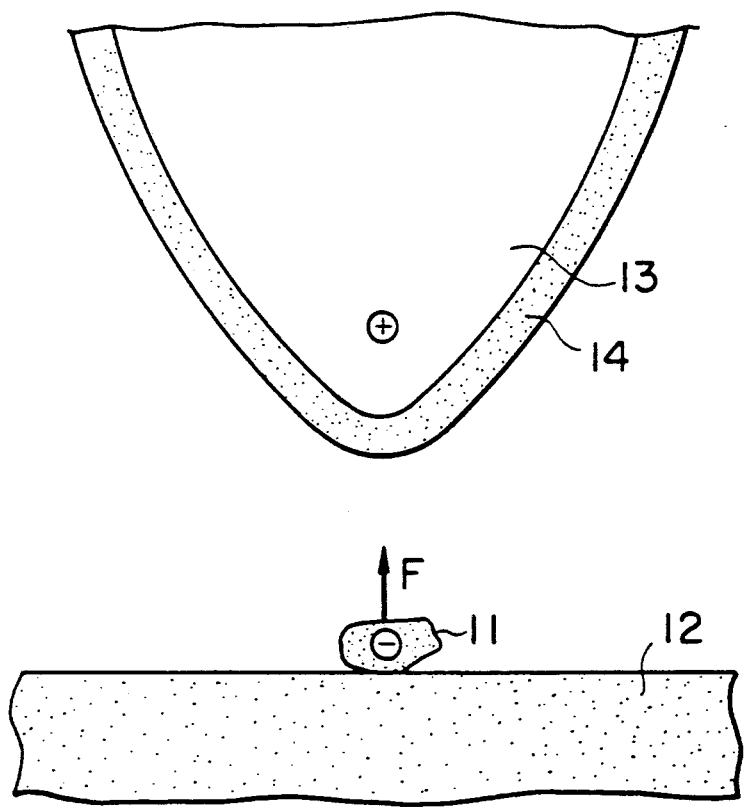
FIG. 2 is a partly cross sectional view of a ultrafine particle manipulator according to the present invention.

FIG. 2 is a diagram illustrative of a principle for transporting and disposing the ultrafine particles to an arbitrary location, wherein 11 designates the charged ultrafine particles placed on the unconductive type storing plate 12, 13 designates a needle shaped electrode composed of tungsten, platinum or the like having a radius of curvature of about ~0.1 μm at the distal end thereof, 14 designates an insulating film composed of $SiO_2$ or the like and deposited on the surface of the needle electrode 13 by a method such as a plasma chemical vapor deposition (CVD) or the like, the film having a thickness of 100 Å to 0.1 μm. The needle electrode can be three-dimensionally driven in vacuum by a fine regulating unit using a Piezo-electric device and a rough regulating unit such as a vacuum bellows or a spring like those used in a microscope device well known recently as a scanning tunneling microscopy (STM) [for example, S. T. Tang, J. Boker, and R. H. Storz: Appl. Phys. Lett. 52(3), 1988, 188].

When a positive voltage of about 1 mV–1 V is imposed on the needle electrode 13 and the distal end thereof is approached to a point hundreds of angstrom to 0.1 μm apart from the charged particles, an electrostatic attractive force acts on both the needle electrode and the fine particles and thus the fine particles are left from the storing plate 12 and deposited on the surface of the insulating film 14. In this operation, caution is necessary because when the radius of curvature of the distal end of the needle electrode 13 is made excessively fine as is used in a usual STM ($\leq 100$ Å), or the thickness of the insulating film 14 is made excessively thin ($\leq 100$ Å), the movement of charges are caused by the tunneling and the action of the electrostatic force disappears.

The fine particles deposited on the distal end of the needle electrode can be transported to any arbitrary location by the drive mechanism of the needle electrode. In order to dispose the fine particles on the desired location of a desired substrate, the fine particles are first moved to a location closely adjacent to the surface (~100 Å) of the desired location by the drive mechanism of the needle electrode and then the needle electrode is coupled to ground to remove the action of the electrostatic force. Alternatively, a little reverse voltage is imposed on the needle electrode to apply a repulsion to the fine particles. Note that this handling method is applicable to any arbitrary ultrafine particles such as metal semiconductor and insulator.

Figure 3A:
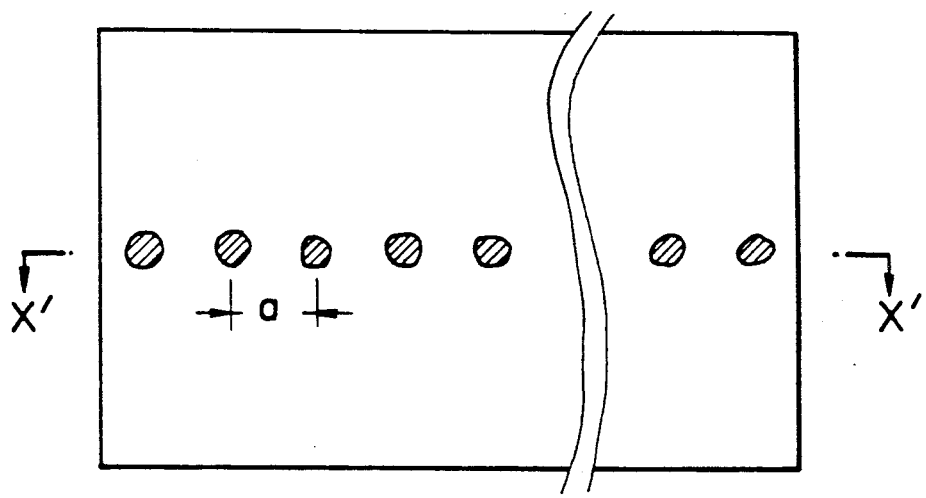
FIGS. 3(A) and 3(B) are a plan view of a gain modulation type laser diode using compound semiconductor quantum boxes and a cross sectional view thereof taken along line X—X' in FIG. 3(A)
Figure 3B:
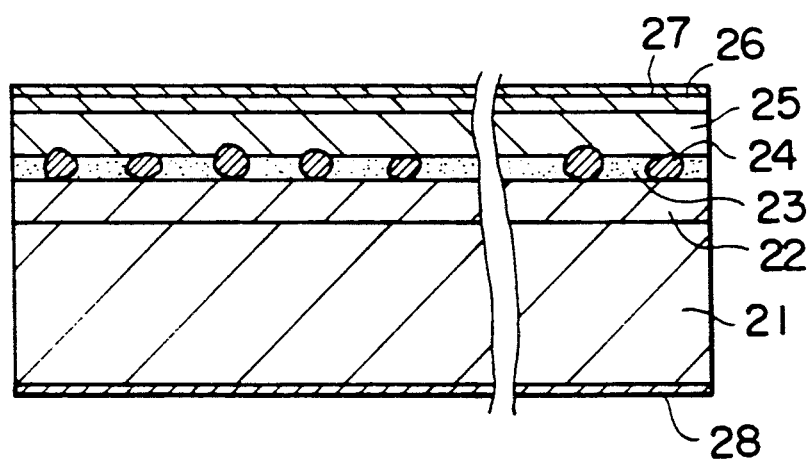

FIG. 3 shows one of embodiments wherein GaAs quantum boxes are applied to the active layer of a semiconductor laser with a short wavelength. FIG. 3(A) is a plan view of the active layer and FIG. 3(B) is a cross sectional view of the structure of the semiconductor laser taken along line X—X' of FIG. 3(A). In FIG. 3(B), 21 designates an n type GaAs substrate, 22 and 25 designate n and p type Al$_x$Ga$_{1-x}$As (x=0.3~0.6) clad layer, respectively (with a thickness of about $\leq$1 μm, respectively), 23 designates a current block layer of SiO$_2$ or the like ($\leq$100 Å), 24 designates GaAs quantum boxes with a size of about ~150 Å), 26 designates a p type GaAs cap layer, and 27 and 28 designate metallic electrodes. The GaAs boxes of $\geq$100 pieces are disposed in line in the X—X' direction with intervals a expressed as follows.

$$a = N \cdot \lambda / n$$

where N is a positive integer, λ is a wavelength of emitted light (in air) (6000~8000 Å), and n is a refraction factor of media. With the arrangement, a laser oscillated light beam having a sharp spectrum in the X—X' direction determined by the constant a can be obtained. The laser beam has a low oscillated threshold current because of high quantum level state density and the oscillation wavelength thereof is very stable to temperature change because it is doubly restricted by the energy value of a quantum level and a.

Figure 4:
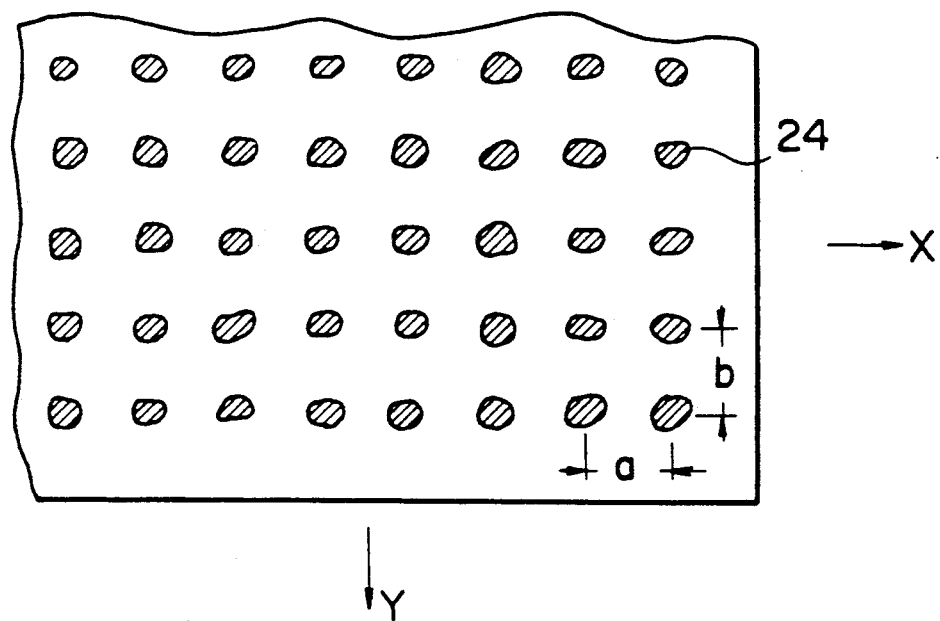
FIG. 4 is a plan view of a gain modulation type laser diode.

FIG. 4 is an embodiment of a semiconductor laser having the active layer of GaAs quantum boxes 24 cyclically disposed two dimensionally. The cross sectional arrangement thereof is the same as that shown in FIG. 3(B). When both cycles a and b are given by integral multiplex of λ/n, a multiple laser beam from which output light beams can be taken in the X and Y directions and the like is obtained. When the cycle in any one direction is given by the integral multiples of λ/n, an output light beam is obtained in that direction only.

A method of producing the devices shown in FIGS. 3 and 4 will be described here in detail (refer to FIG. 6). First, an n type Al$_{0.3}$Ga$_{0.7}$As (carrier density of 1×10$^{18}$ cm$^{-3}$) layer 22 with a thickness of about ~0.5 μm is grown on an n type GaAs substrate (carrier density of 1×10$^{18}$ cm$^{-3}$) 21 by a usual epitaxial growth such as MBE, MOCVD or the like (FIG. 6-a). The above GaAs fine particles 24 (quantum boxes) with a diameter of ~150 Å are disposed on the layer 22 in a one-dimensional line structure or in a two dimensional network structure using the above methods of taking-out, transportation and dispostion (FIG. 6-b). Next, an SiO$_2$ film with a thickness of ~150 Å is deposited by a usual thin film deposition method such as a sputter deposition or the like and the quantum boxes are filled with the film (FIG. 6-c), wherein a selective growth condition is selected to enable the SiO$_2$ film to be deposited only on the AlGaAs and not to be deposited on the GaAs. Next, p type Al$_{0.3}$Ga$_{0.7}$As and p type GaAs (with a thickness of ~0.5 μm and 0.1 μm, respectively, and carrier density of 1×10$^{18}$ cm$^{-3}$ for both materials) are sequentially grown by epitaxy (FIG. 6-d). While the epitaxial growth of the p type AlGaAs may be thought difficult because almost all of the substrate is covered by the amorphous SiO$_2$, this understanding is not correct. More specifically, since the GaAs quantum boxes appearing at places on the surface of the substrate are composed of mono-crystals which act as seeds to cause a phenomenon called seed epitaxy, the seeds are grown to crystals of good quality at least at the vicinity of the seeds. While a region far apart from the seeds has inferior crystallinity and thus high resistance, this region is originally a region where a current block layer (SiO$_2$) exists and no serious obstacle is caused. After the process in FIG. 6-d is finished, electrodes are mounted by a process employed in the fabrication of a usual semiconductor laser to complete a device.

A method of producing a device with the quantum boxes disposed three dimensionally is the same as that described above. A device produced by alternately using a usual thin film deposition method and the above method of taking-out, transportation and deposition of the fine particles will be described below.

Figure 5:
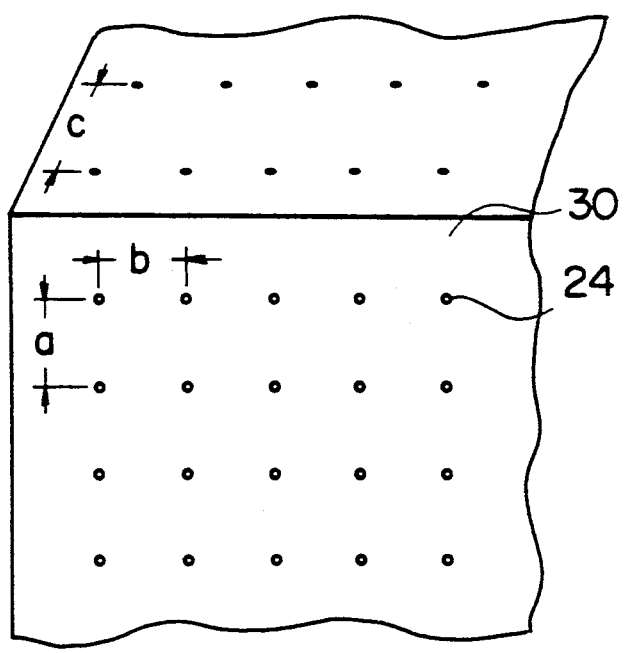
FIG. 5 is a partly perspective view of a gain modulation type laser (an optical pumping type)
Figure 6A:
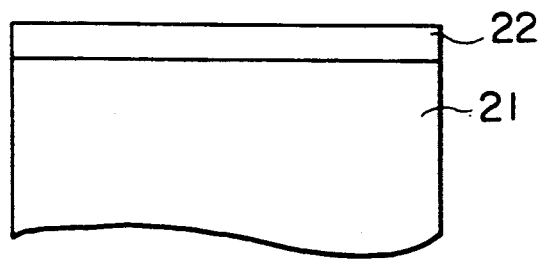
FIG. 6(a) through FIG. 6(d) are diagrams explanatory of a method of producing devices shown in FIGS. 3 and 4.
Figure 6B:
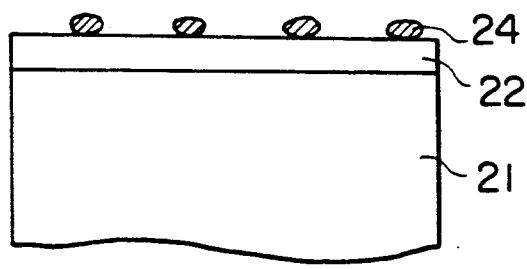
Figure 6C:
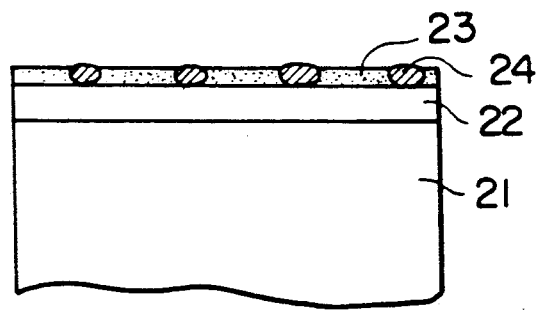
Figure 6D:
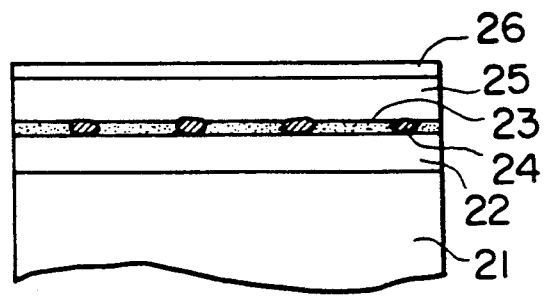

It is difficult to realize a current injection exciting type laser using an arrangement of GaAs quantum boxes cyclically disposed three dimensionally. When media are composed of an optical pumping type material such as SiO$_2$, ITO (indium-tin oxide) or the like which is transparent to light and exited by suitable light, distinguished laser of high performance is obtained. FIG. 5 shows an embodiment of it, wherein the GaAs quantum boxes 24 are cyclically embedded in media 30 of SiO$_2$ three dimensionally. All or a part of cycles a, b and c is given by integral multiples of λ/n. When this arrangement is exited by irradiating suitable light (with a wavelength shorter than the intervals of a quantum well level) from the outside, multi-beam oscillation (or single beam) is obtained.

Note that while GaAs quantum boxes are used in the above embodiments, other quantum boxes of compound semiconductors of Groups III-V or Groups II-VI such as InP may be used. A production method and handling of these quantum boxes must be based on the present invention and other components (semiconductor thin films, metallic electrodes and the like) thereof must be prepared by a usual method such as MBE.

According to the present invention, compound semiconductor quantum boxes of which production has been conventionally very difficult even by the latest sub-micron lithography techniques can be very easily produced on a large scale. Since the quantum level of the quantum boxes is determined by the size thereof, it is important to prepare various sizes to use the quantum boxes as the active layer of a laser element. According to the present invention, ultrafine particles of various sizes can be sized, stored, transported and disposed with each size thereof. This method is applicable not only to the ultrafine particles of the compound semiconductors but also to metallic ultrafine particles of iron, nickel and the like which are already produced on an industrial scale and ultrafine particles of any other arbitrary materials. Further, a laser element using, as the active layer thereof, the quantum boxes composed of the ultrafine particles of the compound semiconductors and disposed in synchronism with the wavelength of emitted light can provide a multi-beam laser element having a low threshold value and narrow line width which are required in the fields of communications, measuring instruments, computers and the like.

What is claimed:

1. A method for producing compound semiconductor quantum boxes, comprising:
    (a) filling a reaction chamber with vapor of a first element of Group V or VI which is one raw material for forming ultrafine particles in a gas phase;
    (b) providing a second element, which is selected from the elements of Group II or Group III and which is another raw material for forming ultrafine particles in a gas phase, to said reaction chamber filled with said vapor of said first element of Group V or VI under a controlled pressure;
    (c) producing ultrafine particles in a gas phase having a particle size distribution in a wide range as a result of collisions and reactions between said first and second elements;

(d) transferring said ultrafine particles downwardly by gravity forces and then transferring said ultrafine particles horizontally by electrostatic forces to separate said ultrafine particles with respect to particle size; and (e) storing respective ultrafine particles separated with respect to particle size by said gravity forces and said electrostatic forces in respective storage devices to provide said quantum boxes having respective different properties.

2. The method of claim 1, wherein said storing devices is a non-conductive material.

3. The method of claim 1, wherein said storing device is a conductive material.

4. The method of claim 1, wherein said first element is Ga, and said second element is As.

5. The method of claim 1, wherein quantum boxes formed in step (d) are selected depending upon their size so as to collect in step (f) the quantum boxes having a desired size in said storing device.

6. A method for producing compound semiconductor quantum boxes, comprising:

(a) filling a reaction chamber with vapor of a first element of Group V or VI under a controlled pressure;

(b) providing a second element selected from the elements of Group II or Group III to said reaction chamber filed with said vapor of said first element of Group V or VI under said controlled pressure;

(c) forming ultrafine particles of different sizes within said chamber in a gas phase as a result of collisions and reactions between said first and second elements;

(d) separating and collecting said ultrafine particles formed in step (c) in respective storage devices in accordance with different sizes of said ultrafine particles to provide said quantum boxes having respective different properties.

* * * * *